(12) United States Patent
Shapira et al.

(10) Patent No.: US 6,876,054 B2
(45) Date of Patent: Apr. 5, 2005

(54) INTEGRABLE DC/AC VOLTAGE TRANSFORMER/ISOLATOR AND ULTRA-LARGE-SCALE CIRCUIT INCORPORATING THE SAME

(75) Inventors: Shye Shapira, Allentown, PA (US); William B. Wilson, Macungie, PA (US); Gerard Zaneski, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/629,435

(22) Filed: Jul. 29, 2003

(65) Prior Publication Data

US 2005/0023632 A1 Feb. 3, 2005

(51) Int. Cl.$^7$ .................. H01L 29/00; H01L 21/8238
(52) U.S. Cl. .................. 257/501; 257/499; 257/500; 257/505; 257/506; 438/218; 438/219; 438/294; 438/353

(58) Field of Search .................. 257/499–501, 257/505–506, 618; 438/218–219, 294, 353, 400

(56) References Cited

U.S. PATENT DOCUMENTS 6,150,708 A * 11/2000 Gardner et al. ............. 257/618

* cited by examiner

*Primary Examiner*—Donghee Kang

(57) ABSTRACT

An electronic device, a method of manufacturing an electronic device and an integrated circuit that employs at least one such electronic device to couple first and second circuits together in an isolated fashion. In one embodiment, the electronic device includes a first conductive channel, a second conductive channel and an isolation layer. The isolation layer is formed from and over the first conductive channel, interposing the first conductive channel and the second conductive channel and configured both to isolate the second conductive channel electrically from the first conductive channel and transfer momentum between charge carriers in the first conductive channel and charge carriers in the second conductive channel.

22 Claims, 4 Drawing Sheets

INTEGRABLE DC/AC VOLTAGE TRANSFORMER/ISOLATOR AND ULTRA-LARGE-SCALE CIRCUIT INCORPORATING THE SAME

TECHNICAL FIELD OF THE INVENTION

The present invention is directed, in general, to an integrated circuit (IC) component and, more specifically, to an integrable DC/AC voltage transformer/isolator for use in an Ultra-Large-Scale Integrated (ULSI) circuit and a ULSI circuit incorporating one or more of such transformer/isolator.

BACKGROUND OF THE INVENTION

It would be difficult to overstate the importance that ICs have attained in today's electronic devices. They perform the core functions of computers, communications devices, automobiles, airplanes, thermostats, calculators and chemical plants, just to name a few widely diverse examples.

Given their importance and sheer numbers, the quest over the last several decades has been to make ICs smaller, more powerful, less expensive and less energy consumptive. To these ends, IC include larger numbers of devices (mostly transistors) in smaller sizes and greater densities. The progression has been from Large-Scale ICs (LSIs) to Very Large-Scale ICs (VLSIs) to ULSIs.

Electrical isolation is an important objective for many types of circuits, including those embodied as ICs. Isolation in its most basic sense occurs when at least DC voltages are contained to within a circuit (e.g., isolated power supplies). Isolation is extended in some cases to include power (e.g., voltage detectors) and even AC voltages (e.g., certain communications circuits).

The prior art contains several different devices that can bridge isolated circuits, allowing only AC voltages, power or signals to be conveyed as desired. These devices are broadly divided into two classes: passive and active.

Passive devices require no power for their own operation and include transformers (which use magnetic fields to bridge circuits) and capacitors (which use electric fields to bridge circuits). Active devices do require power to operate and include buffers (e.g., differential amplifiers, which block common mode electric signals and use only differential electric signals to bridge circuits) and optocouplers (which use light to bridge circuits).

Passive devices are advantageous in that they are simple and require no power for their own operation. However, transformers are by their nature relatively large and require a structure that does not easily lend itself to integration into an IC. Capacitors are smaller than transformers and are easily integrated into an IC, but must be sized inversely to the frequencies they are to convey—the lower the frequency, the larger the capacitor. This physical constraint renders them unsuitable for many applications.

Active devices are generally more flexible and can in some cases provide greater degrees of isolation, but they require power to operate and often take up larger areas on ICs. Active devices are disadvantageous in ICs where power consumption and size are critical.

The need for effective isolation in ICs, particularly ULSIs, remains unsatisfied. What is needed in the art is a fundamentally new electronic device that provides electrical isolation and is readily integrable into an IC.

SUMMARY OF THE INVENTION

To address the above-discussed deficiencies of the prior art, the present invention provides an electronic device, a method of manufacturing an electronic device and an integrated circuit that employs at least one such electronic device to couple first and second circuits together in an isolated fashion.

One aspect of the present invention provides an electronic device., including: (1) a first conductive channel, (2) a second conductive channel and (3) an isolation layer formed from and over the first conductive channel, interposing the first conductive channel and the second conductive channel and configured both to isolate the second conductive channel electrically from the first conductive channel and transfer momentum between charge carriers in the first conductive channel and charge carriers in the second conductive channel.

Another aspect, of the present invention provides a method of manufacturing an electronic device, including: (1) forming a first conductive channel, (2) forming an isolation layer from and over the first conductive channel and (3) forming a second conductive channel proximate the isolation layer, the isolation layer configured both to isolate the second conductive channel electrically from the first conductive channel and transfer momentum between charge carriers in the first conductive channel and charge carriers in the second conductive channel.

Yet another aspect of the present invention provides an integrated circuit, including: (1) a substrate, (2) a first circuit supported by the substrate and configured to carry a current, (3) a second circuit and (4) an electronic device, including: (4a) a first conductive channel supported by the substrate and coupled to the first circuit, (4b) a second conductive channel supported by the substrate and coupled to the second circuit and (4c) an isolation layer formed from ard over the first conductive channel, interposing the first conductive channel and the second conductive channel and configured both to isolate the second conductive channel electrically from the first conductive channel and transfer momentum between charge carriers in the first conductive channel and charge carriers in the second conductive channel.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
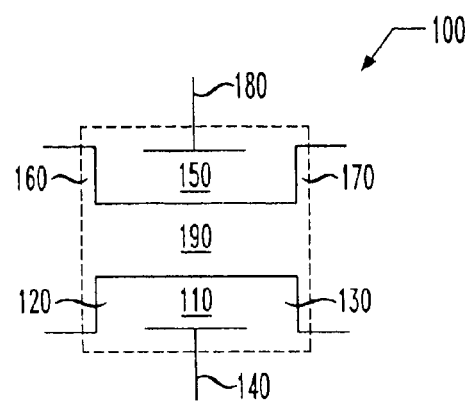
FIG. 1 illustrates a schematic diagram of one embodiment of an electronic device constructed according to the principles of the present invention.

Referring initially to FIG. 1, illustrated is a schematic diagram of one embodiment of an electronic device, generally designated 100, constructed according to the principles of the present invention. The electronic device 100, and indeed other devices falling within the broad scope of the present invention, uses momentum transfer, also called "coulomb drag," to bridge signals from one circuit to another while maintaining isolation for DC and AC voltages and power. Momentum transfer between charge carriers (e.g., electrons or holes) in two separate layers occurs when the layers are very close to each other and charge carriers flow through one of the layers. Carriers from both layers collide, exerting electrical or mechanical forces on each other as they flow through, transferring at least some of their momentum into the other layer. For this reason, coulomb drag may be thought of as interlayer charge carrier friction (viscosity).

The result of that momentum transfer is that a current on one side of the dielectric layer causes a concomitant current on the other side of the dielectric layer without (neglecting quantum tunneling) the charge carriers themselves having traversed the dielectric layer. Unlike transformers, capacitors, buffers and optocouplers (which, as will be recalled, respectively use magnetic, electric, differential signals and light as a transfer medium), the electronic device 100 uses intercarrier momentum transfer, a mechanical effect, as its transfer medium. Because coulomb drag occurs as among conductive channels and dielectric layers in the context of the present invention, it is properly characterized as "interlayer coulomb drag."

As a consequence, isolation can be readily incorporated into ICs without requiring external circuitry or components. Voltage and current sensors can be formed entirely on ICs without relying on magnetic or optical components or capacitors for isolation.

From a structural standpoint, the electronic device 100 includes a first conductive channel 110 interposing a first source 120 and a first drain 130. A first gate 140 is associated with the first conductive channel 110.

The electronic device 100 further includes a second conductive channel 150 interposing a second source 160 and a second drain 170. A second gate 180 is associated with the second conductive channel 150.

Interposing (located between) the first conductive channel 110 and the second conductive channel 150 is an isolation layer 190. The isolation layer is configured both to isolate the second conductive channel 150 electrically from the first conductive channel 110 and allow a transfer of momentum between charge carriers (not shown) in the first conductive channel 110 and charge carriers (also not shown) in the second conductive channel 150.

Under the influence of a voltage originating from an external first circuit (not shown in FIG. 1), and further under control of the first gate 140, charge carriers flow from the first source 120 through the first conductive channel 110 to the first drain 130. An arrow 220 signifies this flow. Along the way, and as described above, the charge carriers in the first conductive channel 110 collide or otherwise mechanically interact with the charge carriers in the second conductive channel 150. The collisions or interactions result in the transfer of momentum from the charge carriers in the first conductive channel 110 to the charge carriers in the second conductive channel 150.

The collisions or interaction between charge carriers of the first conductive layer 110 and the second conductive layer 150 can occur by several mechanisms. The most important is by electrical ("coulomb") forces occurring between the carriers. Other mechanisms include exchange of mechanical vibrations ("phonons") or electrical vibrations ("plasmons"). All of these mechanisms result in a net momentum transfer from carriers in the first conducting channel 110 to carriers in the second conductive channel 150.

The momentum is transferred to the charge carriers contained in the second conductive channel 150, causing them to flow in a direction parallel, and at a rate proportional, to the flow of charge carriers in the first conductive channel 110. An arrow 230 signifies this flow. This relationship between the flow of the charge carriers in the second conductive channel 150 as a result of the flow of the charge carriers in the first conductive channel 110 is "coulomb drag." Alternatively, under certain conditions, the charge carriers in the first conductive layer 110 may be locked in to the charge carriers in the second layer 150 and flow together. Such a scenario may happen, for example, when the carriers in the first and second conductive channels 110, 150 are of opposite polarity and bind to each other by electrical forces as electrons are bound to the nucleus of an inert gas. In this case, a charge flow of carriers in the first conductive layer 110 may result in an equivalent flow of carriers in the second conductive channel 150.

Because the isolation layer 190 is dielectric, charge carriers are barred by classical mechanics from crossing the isolation layer 190. This classical barrier achieves the desired electrical isolation between the first conductive channel 110 and the second conductive channel 150. However, those skilled in the pertinent art will understand that quantum tunneling could allow minute numbers of charge carriers to cross the isolation layer 190, resulting in a tunneling current. However, a device may be designed with a sufficiently thick isolation layer 190 so that any tunneling current is small.

It has been observed that coulomb drag diminishes rapidly as a function of 1/r, where r is the distance separating the first and second conductive channels 110, 150 (i.e., the thickness of the isolation layer 190). Therefore in Complementary Metal Oxide Semiconductor (CMOS) technology, it is best to use the thinnest oxide used for "core" CMOS Field-Effect Transistors (FETs). The illustrated isolation layer 190 is 17 angstroms thick, which is the gate oxide thickness implemented in today's standard CMOS 130 nm IC technology. Those skilled in the pertinent art should understand, however, that the isolation layer 190 can be of any appropriate thickness to preserve electrical isolation and effect meaningful coulomb drag. It is also advantageous to use an isolation layer with a low dielectric constant (such as silicon dioxide) that retains large electric forces between carriers in the two layers.

The electronic device 100 is illustrated as being a six-terminal device, with first and second sources, drains and gates 120, 160, 130, 170, 140, 180. Those skilled in the pertinent art should understand, however, that the first and second gates 140, 180 are optional. The electronic device 100 may therefore be a four- or five-terminal device. Those skilled in the pertinent art should further understand that the first and second conductive channels 110, 150 may interpose conductive terminals instead of respective first and second sources and drains. The terminals would serve merely to convey current between external circuits and the first and second channels 110, 150.

In the absence of a first gate 140, charge carriers flow through the first conductive channel 110 as a function of voltage and innate channel properties. Likewise, in the absence of a second gate 180, charge carriers flow through the second conductive channel 150 as a function of the strength of coulomb drag and innate channel properties. The first and second gates 140, 180 serve to change innate channel properties by way of applied electric fields, but are highly desirable if the characteristics of the electronic device 100 need to be changed during its operation.

Figure 2:
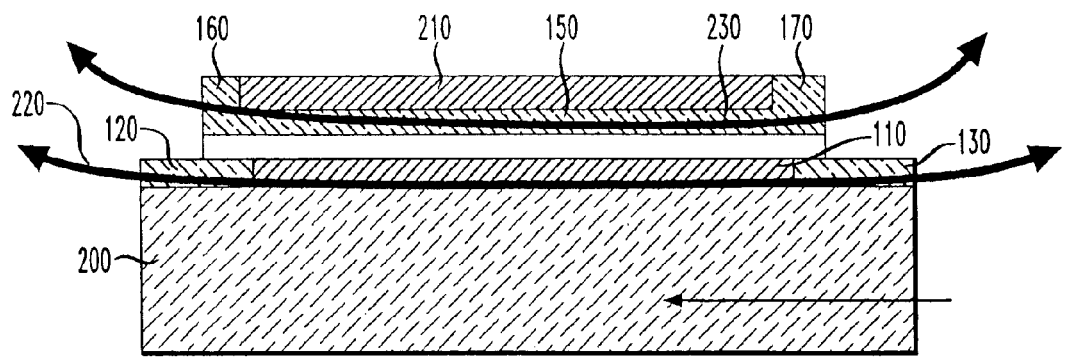
FIG. 2 illustrates an elevational view of one embodiment of the electronic device of FIG. 1.

Turning now to FIG. 2, illustrated is an elevational view of one embodiment of the electronic device 100 of FIG. 1. FIG. 2 is presented primarily for the purpose of showing how the electronic device 100 may be embodied in a conventional ULSI wafer substrate.

A substrate 200 contains a first source 120 and a first drain 130. The substrate may optionally be used as a first gate 140. A first conductive channel 110 interposes the first source 120 and the first drain 130.

An isolation layer 190 is formed from and over the first conductive channel 110. The isolation layer 190 may take the form of a poly gate oxide or any type of insulating layer. For example, an insulating layer may be formed by a semiconductor which has been depleted of charge carriers either by an external or built-in potential, such as in a pn junction.

Those skilled in the art will recognize that, so far, a conventional FET structure has been described. However, the remaining structure departs from that of a conventional FET.

A second source 160 and a second drain 170 (and, optionally, a second gate 180) are formed in an overlying substrate (not referenced separately from the substrate 200. A second conductive channel 150 interposes the second source 160 and the second drain 170.

Though optional, a region of opposite polarity 210 is located in the second conductive channel 150. The region of opposite polarity may be formed by replacing the gate salicide and implanting an opposite doping in the upper part of the second conductive channel 150. Alternatively, the region 210 may be an etch of the upper part of the second conductive channel 150. The region of opposite polarity 210 serves to urge the charge carriers in the second conductive channel to gather proximate the isolation layer 190 and thereby enhance coulomb drag. An arrow 220 illustrates the charge carrier flow. Though not shown or referenced in FIG. 2, a passivation layer is typically located over the electronic device 100. The first and second conductive channels 110, 150 may be implemented by proper voltage bias between the first and second drains 130, 170 thus forming inversion layers on both sides of the isolation layer 190 as is customary forming a Metal Oxide Semiconductor FET (MOSFET) inversion layer by voltage bias on a gate. However the first and second conductive channels 110, 150 may also be defined by forming two thin semiconductor channels confined between the isolation layer 190 and an additional insulator (not shown).

Having described the electronic device 100 both in schematic and structural terms, some of its possible uses in the context of external circuitry will now be described. Those uses fall into two general classes: current output and voltage output.

Figure 3:
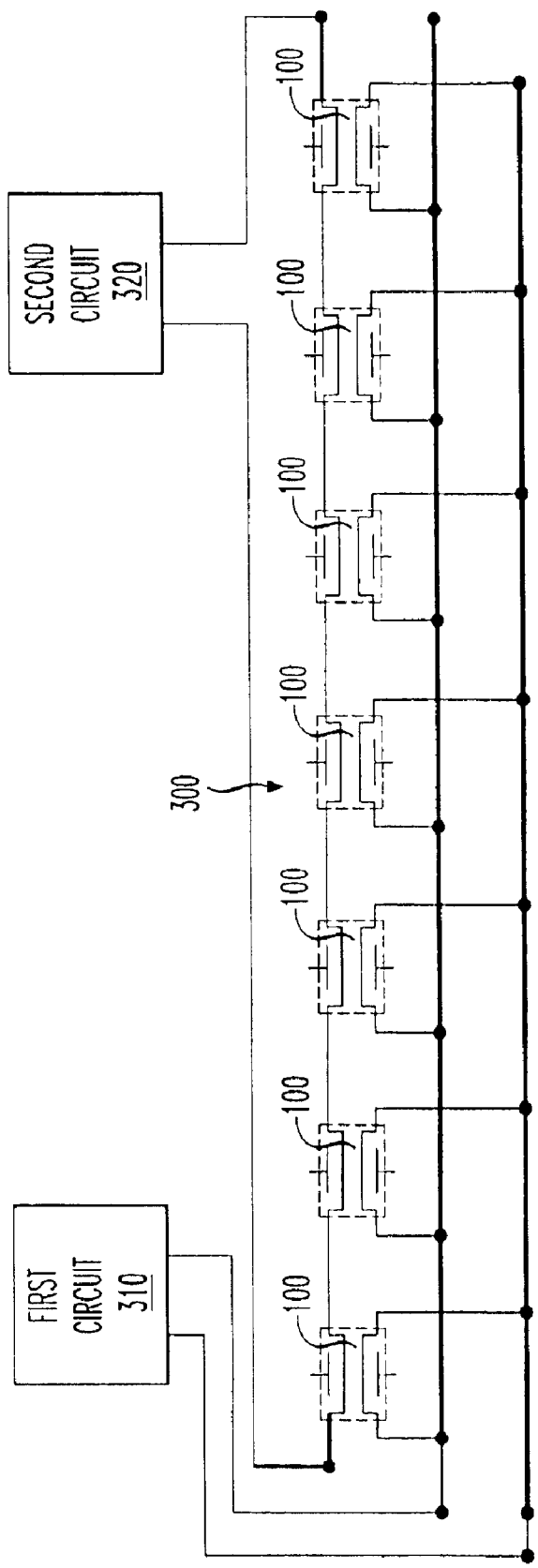
FIG. 3 illustrates a schematic diagram of multiple electronic devices of the kind illustrated in FIG. 1 coupled to provide an enhanced voltage output.

Turning now to FIG. 3, illustrated is a schematic diagram of multiple electronic devices of the kind illustrated in FIG. 1 coupled to provide an enhanced voltage output. FIG. 3 illustrates an isolation circuit 300 that includes a plurality of electronic devices 100 of the type illustrated in FIG. 1. Those skilled in the art recognize that the isolation circuit 300 is advantageously embodied in an IC, though such need not be the case.

The plurality of electronic devices 100 are coupled in parallel to a first circuit 310. The plurality of electronic devices 100 are also coupled in series to a second circuit 320. If the purpose of the second circuit 320 is voltage detection, it will be assumed that the second circuit 320 has a very high (perhaps infinite) impedance.

During operation of the first circuit 310, voltages are developed across the parallel-coupled plurality of electronic devices 100. The voltages cause charge carriers therein to flow across the respective first conductive channels therein. The resulting momentum is transferred in part to corresponding charge carriers in the respective second conductive channels therein. Because the second circuit 320 has a high impedance, the flow of charge carriers in the second conductive channels causes the charge carriers to pool at the respective second drains and a resulting voltage across the electronic devices 100. Because the plurality of electronic devices 100 are coupled to the second circuit 320 in series, the voltages compound, creating a resulting voltage across the entire isolation circuit that is the sum of the various electronic device 100 voltages. The result is that the second circuit 320 can readily detect currents or voltages in the first circuit 310. Also, the first circuit 310 and the second circuit 320 may be interchanged to obtain an enhanced current output. However due to the presence of the insulating layer (and neglecting tunneling currents), no current can flow from the first circuit 310 to the second circuit 320.

Figure 4:
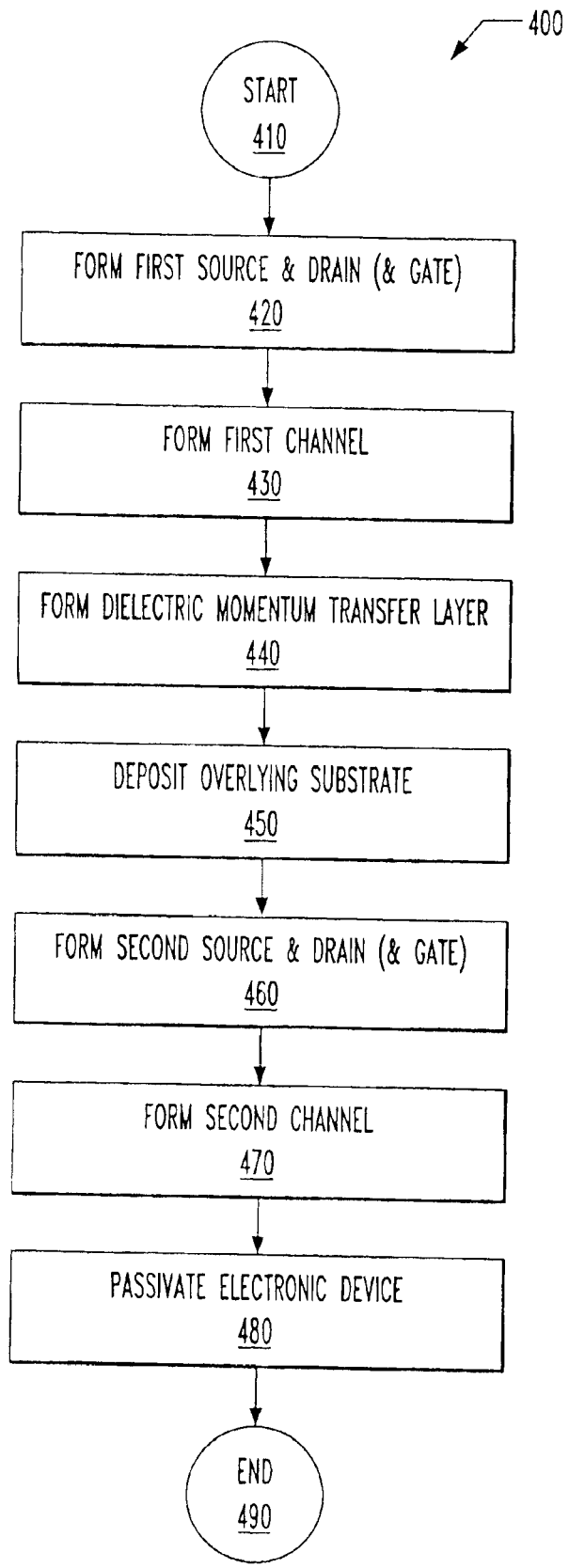
FIG. 4 illustrates a flow diagram of one embodiment of a method of manufacturing an electronic device carried out according to the principles of the present invention.

Turning now to FIG. 4, illustrated is a flow diagram of one embodiment of a method of manufacturing an electronic device carried out according to the principles of the present invention.

The method, generally designated 400, begins in a start step 410 wherein a first source and a first drain (and, optionally, a first gate) is formed in a substrate. Next, in a step 420, a first conductive channel is formed that interposes the first source and the first drain. The first conductive channel may be formed using a CMOS tub diffusion process. Then, in a step 430, an isolation layer is formed proximate (e.g., over) the first conductive channel.

Next, in a step 440 material constituting an overlying substrate is deposited over the isolation layer. Then, in a step 450, a second source and a second drain (and, optionally, a second gate) are formed in the overlying substrate. Next, in a step 460, a second conductive channel is formed in the overlying substrate that interposes the second source and the second drain. The second conductive channel may comprise a polysilicon MOS gate material. Then, in an optional step 470, a region of opposite polarity is formed in the second conductive channel to urge the charge carriers therein to gather proximate the isolation layer and thereby enhance coulomb drag. Next, in a step 480, the electronic device is passivated by depositing an overlying layer, and the method 400 ends in an end step 490.

Figure 5:
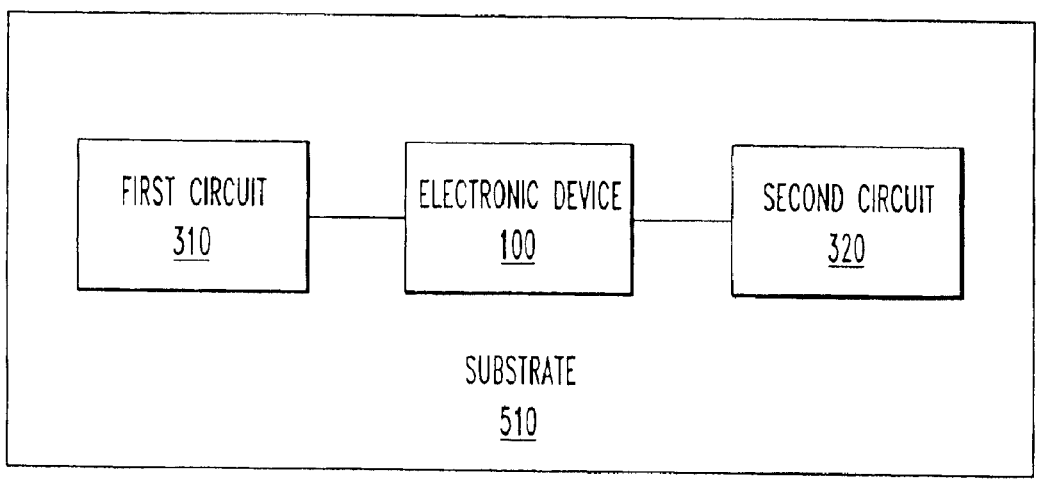
FIG. 5 illustrates a diagram of one embodiment of an IC incorporating at least one electronic device of the kind illustrated in FIG. 1.

Turning now to FIG. 5, illustrated is a diagram of one embodiment of an IC incorporating at least one electronic device of the kind illustrated in FIG. 1.

The IC, generally designated 500, employs a substrate 510 as a foundation for its circuitry and is preferably, but not necessarily, a CMOS ULSI circuit. A first circuit 310 is supported by the substrate 510 and configured to carry a current. A second circuit 320 may be supported by the substrate 510 or by another substrate.

One or more electronic devices 100 are supported by the substrate 510 and employed to couple the first and second circuits 310, 320 together. The electronic devices isolate the first and second circuit 310, 320 from one another, but allow signals to be conveyed from the first circuit 310 to the second circuit 320 without compromising isolation.

Although the present invention has been described in detail, those skilled in the art should understand that they can make various changes, substitutions and alterations herein without departing from the spirit and scope of the invention in its broadest form.

What is claimed is:

1. An electronic device, comprising:
    a first conductive channel;
    a second conductive channel; and
    an isolation layer formed from and over said first conductive channel, interposing said first conductive channel and said second conductive channel and configured both to isolate said second conductive channel electrically from said first conductive channel and transfer momentum between charge carriers in said first conductive channel and charge carriers in said second conductive channel.

2. The electronic device as recited in claim 1 wherein said first conductive channel interposes a first source and a first drain and a first gate is associated with said first conductive channel.

3. The electronic device as recited in claim 1 wherein said second conductive channel interposes a first source and a second drain and a second gate is associated with said second conductive channel.

4. The electronic device as recited in claim 1 wherein said electronic device is a CMOS device, said isolation layer comprises silicon dioxide and said second conductive channel comprises a polysilicon MOS gate material.

5. The electronic device as recited in claim 1 wherein said first conductive channel is over said second conductive channel.

6. The electronic device as recited in claim 1 wherein said first conductive channel is coupled to a first circuit, said second conductive channel is coupled to a second circuit and said transfer of said momentum causes a current to flow in said second circuit as a function of a current flow in said first conductive channel.

7. The electronic device as recited in claim 1 wherein said first conductive channel is coupled to a first circuit and said transfer of said momentum causes a voltage to exist across said second conductive channel as a function of a current flow in said first conductive channel.

8. A method of manufacturing an electronic device, comprising:
    forming a first conductive channel;
    forming an isolation layer from and over said first conductive channel; and
    forming a second conductive channel proximate said isolation layer, said isolation layer configured both to isolate said second conductive channel electrically from said first conductive channel and transfer momentum between charge carriers in said first conductive channel and charge carriers in said second conductive channel.

9. The method as recited in claim 8 wherein said electronic device is a CMOS device and said forming said first conductive channel is carried out using a CMOS tub diffusion process.

10. The method as recited in claim 8 wherein said first conductive channel interposes a first source and a first drain and a first gate is associated with said first conductive channel.

11. The method as recited in claim 8 wherein said second conductive channel interposes a first source and a second drain and a second gate is associated with said second conductive channel.

12. The method as recited in claim 8 wherein said isolation layer is about 17 angstroms thick.

13. The method as recited in claim 8 wherein said forming said second conductive channel comprises forming said second conductive channel over said first conductive channel.

14. The method as recited in claim 8 wherein said first conductive channel is coupled to a first circuit, said second conductive channel is coupled to a second circuit and said transfer of said momentum causes a current to flow in said second circuit as a function of a current flow in said first conductive channel.

15. The method as recited in claim 8 wherein said first conductive channel is coupled to a first circuit and said transfer of said momentum causes a voltage to exist across said second conductive channel as a function of a current flow in said first conductive channel.

16. An integrated circuit, comprising:
    a substrate;
    a first circuit supported by said substrate and configured to carry a current;
    a second circuit; and
    an electronic device, including:
        a first conductive channel supported by said substrate and coupled to said first circuit, a second conductive channel supported by said substrate and coupled to said second circuit, ard an isolation layer formed from and over said first conductive channel, interposing said first conductive channel and said second conductive channel and configured both to isolate said second conductive channel electrically from said first conductive channel and transfer momentum between charge carriers in said first conductive channel and charge carriers in said second conductive channel.

17. The integrated circuit as recited in claim 16 wherein said first conductive channel interposes a first source and a first drain and a first gate is associated with said first conductive channel.

18. The integrated circuit as recited in claim 16 wherein said second conductive channel interposes a first source and a second drain and a second gate is associated with said second conductive channel.

19. The integrated circuit as recited in claim 16 wherein said second circuit is supported by said substrate.

20. The integrated circuit as recited in claim 16 wherein said transfer of said momentum causes a current to flow in said second circuit as a function of a current flow in said first conductive channel.

21. The integrated circuit as recited in claim 16 wherein said transfer of said momentum causes a voltage to exist across said second conductive channel as a function of a current flow in said first conductive channel.

22. The integrated circuit as recited in claim 16 further comprising further electronic devices supported by said substrate, each including one of said first conductive channel, one of said second conductive channel and one of said interposed isolation layer, said electronic device and said further electronic devices coupled in parallel to said first circuit and coupled in series to said second circuit.

* * * * *